United States Patent [19]

Garlington et al.

[11] 4,378,326

[45] Mar. 29, 1983

[54] CASTING FILMS OF POLYMERS OF META-PHENYLENE ISOPHTHALAMIDE

[75] Inventors: William D. Garlington; Isadore Swerlick, both of Wilmington, Del.

[73] Assignee: E. I. Du Pont de Nemours and Company, Wilmington, Del.

[21] Appl. No.: 280,134

[22] Filed: Jul. 2, 1981

Related U.S. Application Data

[62] Division of Ser. No. 130,851, Mar. 17, 1980, abandoned.

[51] Int. Cl.$^3$ .............................................. B29D 7/02
[52] U.S. Cl. ................................ 264/216; 264/230; 264/233; 264/235; 264/331.19; 264/342 RE
[58] Field of Search ........... 264/216, 230, 235, 331.19, 264/331.12, 342 R, 342 RE, 346, 233

[56] References Cited

U.S. PATENT DOCUMENTS

| | | | |
|---|---|---|---|
| 2,244,192 | 6/1941 | Flory | 260/78 |
| 2,999,788 | 9/1961 | Morgan | 162/146 |
| 3,063,966 | 11/1962 | Kwolek | 260/78 |
| 3,068,188 | 12/1962 | Beste et al. | 260/30.2 |
| 3,133,138 | 5/1964 | Alexander, Jr. | 264/290 |
| 3,287,324 | 11/1966 | Sweeny | 260/78 |
| 3,300,450 | 1/1967 | Clay | 260/78 |
| 3,414,645 | 12/1968 | Morgan, Jr. | 264/210 |
| 3,560,137 | 2/1971 | Hahn | 8/115.5 |
| 3,822,202 | 7/1974 | Hoehn | 210/23 |
| 4,070,433 | 1/1978 | Miyoshi et al. | 264/233 |
| 4,073,837 | 2/1978 | Kouzai et al. | 264/38 |

FOREIGN PATENT DOCUMENTS 51-122167 10/1976 Japan .
53-11995 2/1978 Japan .

Primary Examiner—James B. Lowe

[57] ABSTRACT

Film of a wholly aromatic polyamide, at least 85% of the repeating units of which are meta-phenylene isophthalamide units, which is undrawn and noncrystalline and which has improved impact strength. Such film is made by heat-treating film of the polyamide which is undrawn and noncrystalline at 400° to 300° C. for from 2 seconds to 2 minutes while maintaining the film at constant length and width permitting it to shrink by at most 20% in each of the length and width.

9 Claims, No Drawings

CASTING FILMS OF POLYMERS OF META-PHENYLENE ISOPHTHALAMIDE

This is a division, of application Ser. No. 130,851, filed Mar. 17, 1980 now abandoned.

BACKGROUND OF THE INVENTION

This invention concerns improvements in and relating to film of aromatic polyamides such as poly-meta-phenylene isophthalamide, and to a process for making the improved film.

Film of an aromatic polyamide is known in the art, such as disclosed in U.S. Pat. Nos. 3,287,324 and 4,070,433, and is desirable for various uses in view of its low flammability. However, as initially prepared, noncrystalline and undrawn film is unsuitable for some uses because of generally inadequate values of certain physical properties indicative of toughness, such as its physical strength as evidenced, for example, by pneumatic impact strength and by resistance to breakage in a wire bend test to be described below. Although crystalline film retains good tenacity and elongation at high temperature, it tends to be brittle. Drawn film tends to have better physical strength, but is expensive to make because of the cost of the apparatus and process used for drawing.

It is therefore an object of this invention to provide film of aromatic polyamide which is noncrystalline and undrawn, and yet has toughness.

It is a further object to provide a process for making such film.

SUMMARY OF THE INVENTION

Film of aromatic polyamide which is noncrystalline and undrawn and which has a pneumatic impact strength of 2 kg-cm/mil and greater has now been made.

More specifically, according to the invention there is now provided a film of a wholly aromatic polyamide at least 85% of the repeating units of which are meta-phenylene isophthalamide units, said polyamide having an inherent viscosity of at least 1.2 deciliters/g in concentrated sulfuric acid at 30° C. at a concentration of 0.5 gram of polymer per 100 cc of solution and being soluble to the extent of 1 g of polyamide in a solvent consisting of 9 g of N,N-dimethylacetamide and 1 g of $CaCl_2.2H_2O$ at 25° C., said film being undrawn and non-crystalline and having a pneumatic impact strength of at least 2 kg-cm/mil.

There is also provided according to the invention a method for treating an undrawn, noncrystalline film of a wholly aromatic polyamide, at least 85% of the repeating units of which are meta-phenylene isophthalamide units, to increase its pneumatic impact strength to at least 2 kg-cm/mil, said polyamide having an inherent viscosity of at least 1.2 deciliters/g in concentrated sulfuric acid at 30° C. at a concentration of 0.5 gram of polymer per 100 cc of solution, said method comprising heating the film to a temperature in the range of 400° to 300° C. for a period of time ranging from about 2 seconds to 2 minutes, while maintaining the film at constant length and width or permitting the film to shrink by at most 20% in each of the length and width.

DETAILED DESCRIPTION OF THE INVENTION

By wholly aromatic polyamide is meant a polyamide derived from a diamine in which each amino group is directly attached to a carbon atom of an aromatic ring, and a dicarboxylic compound in which each carboxyl group is directly attached to a carbon atom of an aromatic ring; in the case of polycyclic aromatic compounds wherein two aromatic moieties are joined by an aliphatic hydrocarbon moiety, both aromatic moieties should be attached to the same carbon atom of the aliphatic hydrocarbon moiety. The wholly aromatic polyamides employed in the present invention are derived from diamines such as meta-phenylenediamine, para-phenylenediamine, 4,4'-diaminodiphenyl ether, 4,4'-diaminodiphenylmethane, 4,4'-diaminodiphenyl sulfone, benzidine, etc., and diacyl halides of dicarboxylic acids such as isophthalic acid, terephthalic acid, 4,4'-bibenzoic acid, 2,2-bis(4-carboxyphenyl)propane, benzophenone-4,4'-dicarboxylic acid, etc. A preferred polyamide contains at least 85% meta-phenylene isophthalamide repeating units, and is preferably at least 95% such repeating units.

As the terms are employed herein, isophthalic acid, isophthaloyl chloride, meta-phenylene isophthalamide units, and poly-meta-phenylene isophthalamide all refer to and include materials and compositions based not only on pure isophthalic acid or isophthaloyl chloride, but also on commercial grades of isophthalic acid or isophthaloyl chloride, which include variable amounts, e.g., often up to about 5% by weight, of other isomers. Also, meta-phenylenediamine refers not only to the pure diamine, but also to commercial grades which contain variable amounts, e.g. up to about 5% by weight, of other isomers. The same may be true of any of the diacyl halides and diamines from which the polyamides are made.

So as to be of high enough molecular weight to attain a pneumatic impact strength of at least 2 kg-cm/mil in the process of the invention, the polyamide used should have an inherent viscosity of 1.2 deciliter/g, preferably 1.3 deciliters/g, measured in concentrated sulfuric acid at 30° C. at a concentration of 0.5 g of polymer per 100 cc of solution.

The wholly aromatic polyamides employed in the present invention have low solubility in most of the common organic solvents. They are conveniently made in a liquid such as N,N-dimethylacetamide (DMAC), N,N-dimethylformamide (DMF), N-methyl-2-pyrrolidone, or dimethylsulfoxide, by either batch or continuous processes, from the aromatic acid in the form of its diacid halide, e.g., the diacid chloride or bromide, and the aromatic diamine. The hydrogen halide liberated in formation of the polyamide can be neutralized by addition of a suitable hydroxide or oxide, so as to provide a salt from the class consisting of calcium bromide, sodium bromide, ammonium bromide, lithium bromide, lithium chloride, calcium chloride, and magnesium chloride. The hydroxide or oxide is chosen to form one of said salts. The salt and liquid are chosen so that they form a solution which has a specific resistance of less than about 5000 ohm-centimeters as measured on a solution of 1/100 of an equivalent of the salt in one liter of the liquid at 20° C. In general a salt concentration of about 0.2 to about 15% by weight of salt to liquid is employed in the practice of this invention. Higher or lower amounts of salt, however, may be used depending upon the particular polymer and solvent employed. The liquid chosen should be one in which the polyamide dissolves to the extent of at least 0.5% by weight at 20° C. Water in an amount of up to 7% by weight, preferably 1 to 4% by weight of liquid, salt, polyamide and water may be present, arising from water formed in neutralization of hydrogen halide with the hydroxide or oxide and from water in the liquid component used. The polyamides have enhanced solubilities in such liquid/salt media, and solutions of about 3 to 30% by weight of the polyamide can be prepared in such liquid/salt media, based on the weight of said liquid. When such solutions are prepared by dissolving a preformed polyamide in such a liquid/salt medium, it is sometimes necessary to heat the mixture, but the polymer will remain in solution on cooling it to room temperature, and heating is preferred to increase the rate of dissolution. Further information about such solutions of polyamides in these liquid/salt media can be found in U.S. Pat. No. 3,068,188.

The heat treated film of the invention remains soluble in such liquid/salt media, e.g. to the extent of 1 g of polyamide in a solvent consisting of 9 g of N,N-dimethylacetamide and 1 g of $CaCl_2.2H_2O$ at 25° C. Solubility in this solvent is indicative that the polyamide is not crosslinked. Heating of the polyamide for longer times and at higher temperatures than those specified herein can lead to crosslinking of the polymer.

Such solutions can be cast into film form on a support. The support can be fabricated of metal such as stainless steel or of a plastic such as polyethylene, polytetrafluoroethylene, or a polyester, e.g., polyethylene terephthalate. In a continuous process, the support can be in the form of an endless belt or a drum. The solution is cast onto the belt in a thickness which is readily calculated from the thickness of the desired dry film and the amount of polymer in the solution. Final film thicknesses of about 2.5 to about 125 micrometers (0.1 to 5 mils), preferably about 6 to about 50 micrometers (0.25 to 2 mils), can be made.

With the film still carried on the support, part of the liquid component of the solvent is removed from the film by vaporizing it with heat at a temperature no greater than about 5° C. below the boiling point of the solution. Liquid is removed in this manner until the amount of liquid remaining in the film is in the range of 50 to 160% by weight based on the amount of polyamide. Thinner films are usually dried to a solvent content in the lower end of this range, while thicker films are dried to a solvent content in the middle or upper part of the range. The heat can suitably be supplied by a heated gas such as air or nitrogen, by conduction from a heated surface (e.g., a coating drum or belt), or by radiant heaters. The time required to dry to the indicated solvent content varies with factors such as the temperature of the gas or heaters used, the thickness of the cast film, and the composition of the solution used, and is easily determined by one of ordinary skill. In the case of removing DMAC from a 1 mil film (dry thickness), temperatures of about 80°–100° C. for 3 to 5 minutes are suitable. As explained below, the film can be removed from the support during or just after this liquid-removal step.

The film is next washed with a fluid comprising a major proportion of liquid water until the amount of residual liquid component of the solvent for the polyamide is reduced to less than 3% by weight, preferably less than 2% by weight, most preferably less than 1% by weight, based on the polyamide, and the amount of residual salt component of the solvent for the polyamide is reduced to less than 0.3% by weight, preferably less than 0.2% by weight, most preferably less than 0.1% by weight, based on the polyamide. The time required for this step varies with factors such as the thickness of the film, the amount of liquid and salt components of the solvent to be removed, and the temperature of the wash water, and is easily determined by one of ordinary skill. In a continuous process, a series of tanks of wash water can be used, and one suitable arrangement is to employ a countercurrent flow of wash water from the last tank progressively toward the first tank. Flooding of each tank separately with fresh water is another suitable arrangement. The wash water can be of any temperature convenient or desired, e.g., from about 1° C. to about 95° C.; temperatures of about 5° to 35° C. are convenient and suitable. The initial wash water into which the film is placed for the first 5 seconds to 1 minute should be below about 20° C., the longer times being needed for thicker films and the shorter times being satisfactory for thinner films. For films 12 to 50 micrometers thick (dry thickness), washing times of about 1 to 20 minutes are typical. At this point, the amount of water in the film is about 50 to 150% by weight based on the weight of the dry film.

Next, wash water which remains in the film is removed from the film by vaporizing it with the aid of heat below a temperature of about 150° C. until the amount of water in the film is less than 15% by weight, preferably less than 8% by weight, based on the polyamide. During this drying step, the film should be maintained at constant length and width or should be permitted to shrink by at most 12% in each of the length and width. Preferably, the film is maintained at constant length (machine direction) and is permitted to shrink by at most 12% in width (transverse direction). Most preferably the film is maintained at constant length and width. In cases where the film remains adherent to the support through part of this drying step, the film is thereby restrained from shrinking in either length or width. After the film has been separated from the support, constant length and width can suitably be maintained, e.g., by use of a pin-type tenter frame, or by keeping the film during drying in contact with the rolls of a roll dryer under tension so that at most only minimal shrinkage occurs. In a roll dryer, shrinkage of up to about 6% can occur in the transverse direction, and by running some of the rolls, e.g., the last rolls, at a slightly reduced speed shrinkage of up to about 2% can occur in the machine direction. The heat required can be supplied in various ways, e.g., rolls heated internally as by steam, hot oil or electrical resistance heaters; heated gas such as air or nitrogen; or radiant heaters. The time required for this drying step varies with factors such as the temperature of the gas or heaters used, the thickness of the film, and the amount of water in the film, and is easily determined by one of ordinary skill. Typically, temperatures ranging from about 60% to about 125° C. for times of 0.5 to 5 minutes are suitable.

The film can be stripped from the support on which it was cast during the water-drying step just described, during the water-washing step which precedes that step, or during the liquid-removal step which precedes washing with water, or at the transitions between these steps. It is preferred to remove the film from the support no later than during the water-washing step so as to increase the efficiency of removal of salt and organic liquid from the film during washing with water.

In accord with the invention, the film is then subjected to a heat treatment step wherein the film is heated to a temperature in the range of 400° to 300° C. for a period of time ranging from about 2 seconds to 2 minutes. Preferably the film is heated to a temperature of 375° to 325° C. for a time from 2 to 30 seconds. The higher temperatures in the indicated ranges will be used for the shorter times indicated, and conversely, the lower temperatures will be used for the longer times. The heat can be supplied, e.g., by radiant heaters, or by a hot gas. The heat treatment can be carried out in any suitable atmosphere, such as air or nitrogen.

During this heat treatment step, the film is maintained at constant length and width, or is permitted to shrink by at most 20% in each of the length and width. Preferably the film is maintained at constant length (machine direction) and is permitted to shrink by at most 20% in width (transverse direction). It is further preferred to restrain the film at least partially in both the length and width, as good sheet flatness, i.e., a non-puckered film, is thereby obtained. Most preferably the film is maintained at constant length and width, which can suitably be accomplished, e.g., by use of a pin-type tenter frame.

Film so made is noncrystalline as determined by X-ray diffraction and is undrawn, i.e., has not been extended to longer dimension in either length or width. It has improved physical strength when compared with film not heat treated, as evidenced by a higher pneumatic impact strength. In accordance with the invention, film having a pneumatic impact strength of at least 2 kg-cm/mil, preferably at least 4 kg-cm/mil, can be prepared. The film is also colorless and transparent, and is thermally stable and flame resistant.

Film of poly-meta-phenylene isophthalamide so made has a density of at least 1.32 g/cc at 25° C., and most often at least 1.33 g/cc at 25° C. Such densities are indicative of at most only a low level of voids in the film. Voids of a size not visible upon inspection by eye, but present as indicated by low angle X-ray analysis, are ordinarily present in the film before the heat treatment of the invention, and are largely removed by coalescence during the heat treatment step.

Most films heat-treated in accordance with the invention also pass the wire bend test (described below) and thus have improved integrity when used for wire insulation, whereas both noncrystalline, undrawn film before heat treatment and crystalline film uniformly fail the wire bend test. Furthermore, film which has been heated too much, i.e., either at too high temperature or for too long a time or both, also fails the wire bend test, is insoluble in the 9:1 DMAC:CaCl$_2$.2H$_2$O solvent described above, and is apparently degraded as evidenced by the onset of a yellow color.

As determined by differential scanning calorimetry, film which has been heat-treated as described herein has a glass transition temperature (second order transition temperature) about 15° C. higher than such film before heat treatment, and both the heat-treated and unheat-treated films exhibit an exotherm indicative of thermal crystallization and an endotherm indicative of crystalline melting. Both types of film, though noncrystalline by X-ray diffraction, thus have some short range order below a size detectable by X-ray diffraction, and are thermally crystallizable.

TEST METHODS

Impact strengths given herein refer to the pneumatic ball impact test method of ASTM (American Society for Testing Materials) D3099.

In the wire bend test, a metal wire of diameter 1.024 mm (AWG wire gauge 18) is wound for 15–20 cm (6–8 inches) of its length with a strip of the film to be tested which is 9.5 mm (⅜ inch) wide, the film strip being tightly wound on the wire with an overlap of about 50% and a wrap angle of about 45°, the two ends of the film strip being secured with small pieces of a pressure sensitive tape (tape with a backing of cellulose acetate film or of cellulose, e.g. "masking tape", is suitable). A small lathe can be used in wrapping the strip of film to be tested on a wire. The portion of wire insulated with film is then immersed for 30 seconds in a bath of molten solder (50:50 tin:lead) maintained at 300° C., removed from the bath, and permitted to cool and cleaned of any adherent solder. The insulated portion of wire is then bent back on itself so as to form 4 to 6 tight spiral loops around its own circumference, and the film insulation on the loops is examined for any breaks. The presence of one or more breaks in the film is rated as a failure, and no breaks in the film is a pass.

To further illustrate the innovative aspects of the present invention, the following examples are provided.

EXAMPLE 1

A solution of poly-meta-phenylene isophthalamide (designated MPD-I), dimethylacetamide (DMAC), and calcium chloride, in the weight ratio 1:3.8:0.47 MPD-I:DMAC:CaCl$_2$, plus about 1.5 weight percent water at room temperature, was pumped through a 0.34 mm×27.9 cm wide (13.5 mil×11 inches wide) slot opening at about 38 ml/minute onto a 0.076 mm (3 mil) thick polyester film carrier travelling at 0.9 m (3 feet) per minute. It was then passed continuously into an arch air dryer with 3.66 m (12 foot) heated length, air jets on the top side, 88° C. inlet air temperature. At the dryer's exit end, the concentrated solution film, designated "gel film", and its carrier were interleafed with 1 mil polyethylene film and wound up. The DMAC to polymer ratio in this gel film was approximately 1.6:1.

Subsequently, the polyethylene interleaf was stripped and the gel film on its carrier was unwound at the rate of 0.9 m (3.0 feet) per minute into a series of five room temperature water leach baths, with a total wet immersion of 7.3 m (24 feet). Each of the last four tanks were separately flooded with about 7.6 liters (2 gallons) per minute of room temperature deionized water; the first with 7.6 liters (2 gallons) per minute of cold tap water.

From the leach baths the wet film was transported at the same rate onto a 5-roll 20.3 cm (8-inch) diameter aluminum heated dryer. After about 270 degrees of contact on the first roll, the carrier film was stripped off and the wet MPD-I film continued through the dryer. Dryer roll surface temperatures were typically 100°, 85°, 105°, 125° and 125° C.

The dried MPD-I film was transported out of the dryer and wound up. Analyses indicated it contained typically 1.7% DMAC, 460 ppm calcium and 800 ppm chlorine. Tests showed it would shrink about 20% in either direction if heated to 280° C.

A piece of this film was restrained on a rectangular pin frame, with sharp pointed nails spaced every 19 mm (¾ inch) around the periphery, and placed in a convective air oven for various temperatures and times. Results are shown in Table 1, and indicate that if such film is heat-treated under restraint at 340° C. for 10 to 30 seconds its properties were improved. Its shrinkage when reheated, unrestrained, to 280° C. for ten minutes was less than 2%. Surprisingly, its equilibrium moisture absorption was significantly reduced and it showed increased toughness in the wire bend test.

TABLE 1

| Temp. °C. | Time Sec. | Wire Bend Test | H₂O Absorption % | Reheat Shrinkage 280° MD | TD |
|---|---|---|---|---|---|
| 340 | 30 | Passed | 4.03 | 1.3% | 0% |
| 340 | 20 | Passed | 3.72 | | |
| 340 | 10 | Passed | 3.28 | | |
| 200 | 120 | Failed | — | | |
| 200 | 190 | Failed | — | | |
| No heat Treatment | | Failed | 5.96 | ~20% | |
| | | Failed | 7.62 | ~20% | |

Other pieces of the dried MPD-I film were heat treated similarly while restrained on a pin frame, at 340° C. and at 400° C. in an oven for 60 seconds (actually slightly less than 60 seconds, as the pin frame and sample were removed from the oven after 30 seconds, rotated 180°, and quickly replaced in the oven for the remainder of the 60 seconds, to compensate for front-to-back nonuniformities in the oven). The impact strengths are given in Table 2.

TABLE 2

| | Heat Treatment | | Pneumatic Impact, kg-cm/mil | | | |
|---|---|---|---|---|---|---|
| | Temp. °C. | Time Sec. | Avg. | Range | No. Samples | Type Failure |
| Sample | 340 | 60 | 10.6 | 1.8–21 | 6 | Stretch |
| | 400 | 60 | 1.7 | 1.6–1.9 | 3 | Stretch to brittle |
| Control | No treatment | | 0.92 | .70–1.0 | 5 | Brittle |

Another sample of film made in substantially the same way, and heat-treated in an oven at 360° C. for 30 seconds was determined by X-ray diffraction to be noncrystalline.

EXAMPLE 2

The procedure of Example 1 was substantially repeated to prepare films of nominal thickness 25 micrometers (1 mil), but with the following differences. The air temperature in the arch air dryer was 93° C. The DMAC to polymer ratio in the gel film was 1.28. Washing with deionized water at room temperature was in a series of four tanks with a total wet immersion of 11.6 m (38 ft), with the water flowing countercurrently from tank to tank at the rate of 7.6 liters (2 gallons) per minute. The line speed for water washing and the following drying step was 1.8 m/minute (6 ft/minute). A dryer with five rolls was used, with the polyester carrier film being stripped from the MPD-I film after the third roll; the surface temperatures of the rolls were 70°, 90°, 90°, 100° and 100° C. Samples of the film were heat treated at various temperatures for various times, with the conditions and results as shown in Table 3. All of these films were determined to be noncrystalline by X-ray diffraction.

TABLE 3

| Heat-Treatment Conditions | | Impact kg-cm/ mil | Inherent Viscosity | Wire Bend | | Residual DMAC PPM | Density g/cc |
|---|---|---|---|---|---|---|---|
| Temp. °C. | Time Min. | | | Pass | Fail | | |
| CONTROL | | 0.45 | 1.29 | 0 | 3 | 6280 | 1.3026 |
| | | 0.90 | | | | | 1.3062 |
| 240 | 1 | .92 | | | | | |
| 260 | 1 | 1.10 | | | | | |
| 280 | 1 | 2.98 | | | | | |
| 300 | .5 | 4.47 | 1.35 | 3 | 0 | 3940 | 1.329 |
| | 1 | 4.63 | 1.35 | 3 | 0 | 2800 | 1.3358 |
| | 2 | 2.76 | 1.34 | 2 | 1 | 1330 | 1.3327 |
| 325 | .5 | 5.38 | 1.33 | 2 | 1 | 1520 | 1.3374 |
| | 1 | 5.86 | 1.36 | 3 | 0 | 900 | 1.3341 |
| | 2 | 5.55 | 1.34 | 3 | 0 | 300 | 1.3364 |
| 350 | .5 | 2.03 | 1.44 | 3 | 0 | 200 | 1.3364 |
| | 1 | 3.44 | — | 3 | 0 | 26.5 | 1.3347 |
| 375 | .5 | 3.47 | — | 0 | 3 | 4.7 | 1.3298 |
| 400 | .5 | 2.13 | — | 0 | 3 | 7.0 | 1.3375 |

EXAMPLE 3

The procedure of Example 2 was substantially repeated to prepare films of nominal thickness 13 micrometers (0.5 mil), 25 micrometers (1 mil) and 51 micrometers (2 mils). The DMAC/polyamide ratio of the film just before water immersion is shown in Table 4. It was next leached in ice water for 1 hour, was separated from the support film, and was dried with restraint in an air oven at 120° C. for 1 hour. Next the film was heat-treated at 325° C. for 1 minute. The resulting properties of the heat-treated film, and the control unheat-treated film are also shown in Table 4.

TABLE 4

| Nominal thickness of dry film, mils | 2.0 | 1.0 | 0.5 |
|---|---|---|---|
| DMAC/polyamide ratio | 1.46 | 1.28 | 1.05 |
| Pneumatic Impact, kg-cm/mil: | | | |
| Heat treated | 6.4 | 6.4 | 4.1 |
| Control, not heat-treated | 0.5 | 0.7 | 0.6 |
| Wire bend: pass/fail | | | |
| Heat-treated | 3/0 | 3/0 | 3/0 |
| Control | 1/2 | 0/3 | 0/3 |
| Density: g/cc | | | |
| Heat-treated | 1.3412 | 1.3418 | 1.3373 |
| Control | 1.3295 | 1.3377 | 1.3309 |

EXAMPLE 4

The procedure of Example 3 was substantially repeated to prepare films 30 micrometers (1.2 mils) in thickness. Samples of the film were heat treated at various temperatures for 2 minutes, either while restrained on a frame or unrestrained. During heat treatment, the samples were covered on the side toward the high velocity stream of heated air with a glass cloth fabric, which retarded the rate of heating as compared to the rate when no such fabric is used. The results are given in Table 5.

TABLE 5

| Heat Treatment Conditions | | Pneumatic Impact kg-cm/mil Avg. | Lineal Shrinkage % | Final film Thickness mils |
|---|---|---|---|---|
| | Temp. °C. | | | |
| Unrestrained | 300 | 5.3 | 19 | 1.9 |
| | 325 | 5.7 | 22 | 2.0 |
| | 350 | 7.3 | 25 | 2.1 |
| | 375 | 6.0 | 25 | 2.0 |
| Restrained | 300 | 3.6 | — | 1.2 |

TABLE 5-continued

| Heat Treatment Conditions Temp. °C. | Pneumatic Impact kg-cm/mil Avg. | Lineal Shrinkage % | Final film Thickness mils |
| --- | --- | --- | --- |
| 325 | 4.1 | — | 1.2 |
| 350 | 5.4 | — | 1.2 |
| 375 | 3.5 | — | 1.2 |

EXAMPLE 5

The procedure of Example 1 was substantially repeated through the water washing step. The film was then dried on a three roll dryer having chromium plated steel rolls of 20.3 cm (8-inch) diameter, the temperatures of the three rolls being 90°, 95° and 120° C. The film (approx. 25 cm, 10 in, wide) was mounted on a continuous pin-type tenter frame so as to be restrained to constant length and width, and was then heat treated under a panel of 105-volt radiant heaters 15 cm (6 in) long by 25 cm (10 in) wide, having a watt density of 3.1 watts/cm$^2$ (20 watts/in$^2$), the gap between the film and the heaters above the film being 1.9 cm (0.75 in) and the gap between the film and a reflective plate below the film being 1.9 cm (0.75 in). The film was transported past the radiant heater at a rate of 2.06 m/minute (6.75 ft/min), which provided a residence time under the heater of 4.44 seconds. As the average view factor at the center line of the film was 0.85, the effective residence time at the center line of the film was 3.77 seconds. The resulting heat treated film had a pneumatic impact strength of 2.10 kg-cm/mil, whereas the value for film not so heat treated was 1.06 kg-cm/mil. The heat treated film contained 100 ppm DMAC, and the permanent shrinkage (machine direction at the center line) after unrestrained reheating at 280° C. for 10 minutes was 0.76%.

COMPARATIVE EXAMPLE A

The procedure of Example 1 was substantially repeated through the water washing and drying steps. A sample of the film was then clipped to a metal frame and placed in glacial formic acid at 90° C. for 30 minutes in order to crystallize it, this procedure having been shown with another sample of similar film to result in crystallinity as determined by X-ray diffraction. It was then washed in water for several minutes and dried at 100° C. for 30 minutes. This film was 32.5 micrometers (1.28 mils) thick, had a pneumatic impact strength of 1.08 kg-cm/mil, and in three trials in the wire bend test had no passes and 3 failures.

Samples of the film were then heat treated in an oven at 325° C. for 1 minute, and thus constitute crystalline polyamide film heat-treated under the conditions of the invention. This heat-treated film was 30.7 micrometers (1.21 mils) thick, had a pneumatic impact strength of 0.76 kg-cm/mil, and in three trials in the wire bend test had no passes and 3 failures.

COMPARATIVE EXAMPLE B

The procedure of Example 1 was substantially repeated except that the heat treating was done continuously under radiant heaters substantially as described in Example 5. A sample of the heat-treated film was crystallized by placing it in glacial formic acid at 90° C. for 30 minutes, and then it was washed with water and dried at 100° C. for 30 minutes, to provide yet another film which is both heat-treated and crystalline. This film was 32.2 micrometers (1.27 mils) thick, had a pneumatic impact strength of 1.11 kg-cm/mil, and in three trials in the wire bend test had no passes and 3 failures.

INDUSTRIAL APPLICABILITY

The technically advanced film of the invention is useful in various electrical applications, such as wire and cable insulation formed by spiral wrapping of film in the form of tape, and such as slot liners, insulation for transformers, in capacitors, and base and cover sheet for printed circuitry, and is especially good in such uses at high temperature. The film can also be used in automotive and aviation interior head lining materials and decorative trim, and in packaging materials. The method of the invention provides a way to prepare the improved tough film of the invention without resorting to the expense of making a drawn film.

We claim:

1. A process for preparing a film of a wholly aromatic polyamide, at least 85% of the repeating units of which are meta-phenylene isophthalamide units, said polyamide having an inherent viscosity of at least 1.2 deciliters/g in concentrated sulfuric acid at 30° C. at a concentration of 0.5 gram of polymer per 100 cc of solution, said process comprising (1) casting onto a support a film of a solution which comprises
      (a) a liquid from the class consisting of N,N-dimethylformamide, N,N-dimethylacetamide, N-methyl-2-pyrrolidone and dimethylsulfoxide, said polyamide having a solubility at 20° C. of at least 0.5% by weight in said liquid,
      (b) from about 0.2% to about 15% by weight based on said liquid of a salt from the class consisting of calcium bromide, sodium bromide, ammonium bromide, lithium bromide, lithium chloride, calcium chloride, and magnesium chloride, said salt being characterized in that it forms a solution in said liquid which has a specific resistance of less than about 5000 ohm-centimeters as measured on a solution of 1/100 of an equivalent of said salt in one liter of said liquid at 20° C.,
      (c) from about 3 to about 30% by weight of said polyamide based on said liquid, and
      (d) up to 7% by weight of water based on the total weight of said liquid salt, polyamide and water;
   (2) removing said liquid from said film by vaporizing it with heat at a temperature no greater than 5° C. below the boiling point of said solution until the amount of said liquid in said film is in the range of 50 to 160% by weight based on said polyamide;
   (3) washing additional said liquid from said film with water until the amount of said liquid in said film is less than 3% by weight and of said salt in said film is less than 0.3% by weight, each based on said polyamide;
   (4) removing water remaining in said film from said film by vaporizing it with heat below a temperature of about 150° C. until the amount of water in said film is less than 15% by weight based on said polyamide while maintaining said film at constant length and width or permitting the film to shrink at most by about 12% in each of the length and width;
   (5) removing said film from said support at a time during any of steps (2), (3) or (4); and
   (6) heat treating said film at a temperature in the range of 400° to 300° C. for a period of time ranging from about 2 seconds to 2 minutes while maintaining the film at constant length and width or permitting the film to shrink by at most 20% in each of the length and width.

2. The process of claim 1 wherein in step (6) the film is maintained at constant length and is permitted to shrink by at most 20% in width.

3. The process of claim 1 wherein in step (6) the film is maintained at constant length and width.

4. The process of claim 2 or 3 wherein the polyamide is poly-meta-phenylene isophthalamide.

5. The process of claim 4 wherein the liquid is N,N-dimethylacetamide and the salt is $CaCl_2$.

6. The process of claim 5 wherein in step (6) the heat treating is at a temperature of 375° to 325° C. for a time of about 2 to 30 seconds.

7. The process of claim 6 wherein in step (3) said washing is until the amount of said liquid in said film is less than 2% by weight and of said salt in said film is less than 0.2% by weight, each based on said polyamide.

8. The process of claim 7 wherein in step (3) said washing is until the amount of said liquid in said film is less than 1% by weight and of said salt in said film is less than 0.1% by weight, each based on said polyamide.

9. The process of claim 8 wherein in step (4) water is removed until the amount remaining in said film is less than 8% by weight based on said polyamide.

* * * * *